United States Patent [19]
Reuter et al.

[11] Patent Number: 5,557,213
[45] Date of Patent: Sep. 17, 1996

[54] SPRING-LOADED ELECTRICAL CONTACT PROBE

[75] Inventors: Mark S. Reuter, Coventry; John A. Geranis, Johnston, both of R.I.

[73] Assignee: Everett Charles Technologies, Inc., Pomona, Calif.

[21] Appl. No.: 348,565

[22] Filed: Dec. 1, 1994

[51] Int. Cl.[6] .................................................. G01R 1/06
[52] U.S. Cl. .............................................. 324/761; 324/754
[58] Field of Search ............................... 324/754, 72.5, 324/761, 751; 439/825, 751, 482

[56] References Cited

U.S. PATENT DOCUMENTS

| | | | |
|---|---|---|---|
| 3,223,960 | 12/1965 | Ruehlemann | 439/751 |
| 3,761,871 | 9/1973 | Tawlings | 439/751 |
| 4,560,926 | 12/1985 | Cornu et al. | 324/72.5 |
| 4,904,935 | 2/1990 | Calma et al. | 324/761 |
| 4,918,384 | 4/1990 | Giringer et al. | 324/761 |
| 4,935,696 | 6/1990 | DiPerna | 324/761 |
| 5,387,138 | 2/1995 | O'Malley | 439/751 |

Primary Examiner—Vinh P. Nguyen
Attorney, Agent, or Firm—Christie, Parker & Hale, LLP

[57] ABSTRACT

An electrical spring probe includes a barrel having an annular opening therethrough. A plunger is partially disposed within the annular opening at one end and is capable of slidable axial displacement within the annular opening. The plunger includes a tip positioned outside of the barrel for contacting an electrical device. A terminal member is disposed within the annular opening through the barrel at an end opposite to the plunger and is fixedly attached therein. The terminal member includes a flanged end that is positioned outside of the barrel and includes at least one flange that extends radially outward from the flanged end. The flange has a shoulder that is substantially perpendicular to an axis running along the terminal member. A slot is positioned in the flanged end and extends axially along the terminal member from tip of the flanged end a distance toward the barrel. The spring probe forms a locked attachment with a probe receptacle by a snap locking abutment of the shoulder of each flange with an outside edge of an opening in a terminal portion of the receptacle.

31 Claims, 5 Drawing Sheets

SPRING-LOADED ELECTRICAL CONTACT PROBE

FIELD OF THE INVENTION

The present invention relates to electrical contact probes and, more particularly, to spring-loaded contact probes used in electrical testing applications such as providing electrical contact between diagnostic or testing equipment and an electrical device under test.

BACKGROUND OF THE INVENTION

Conventional spring-loaded contact probes generally include an outer receptacle, a movable plunger, a barrel containing the plunger, and a spring for biasing the reciprocating travel of the plunger in the barrel. The plunger is commonly biased outwardly a selected distance by the spring and may be biased or depressed inwardly of the barrel, a selected distance, under force directed against the spring. The plunger generally includes a head or tip for contacting electrical devices under test. Such conventional contact probes are generally referred to herein as three-component probes, since they have a receptacle, barrel and probe member.

In conventional devices, the barrel is mounted within the receptacle with the plunger extending outwardly from the receptacle. Preferably, the barrel is removably mounted in the receptacle, so that should damage occur to the barrel or plunger, replacement is possible. Usually, the receptacle is permanently or semi-permanently mounted in an array within the tester. Electrical wiring may be attached to the receptacle, for electrical communication between the receptacle and the testing diagnostic equipment. Preferably, the probe member, barrel and receptacle are manufactured from electrically conductive materials, so that an electrical circuit is maintained between the electrical device under test and test equipment, by means of the contact probe.

When such electrical probes are used, generally a contact side of the electrical equipment to be tested is brought into pressure contact with the tip of the plunger for maintaining spring pressure against the electrical device. After the electrical device has been tested, the pressure exerted by the spring probes is released and the device is removed from contact with the tip of each probe. In conventional systems, the pressure is released by moving the electrical device and probes away from one another, thereby allowing the plungers to be displaced outwardly away from the barrel under the force of the spring within the barrel, until an enlarged-diameter section of the plunger engages a crimped end portion of the barrel. After repeated test cycles, and repeated instances of the enlarged diameter section contacting the crimped end portion, it has been discovered that the plunger and barrel assemblies become axially displaced from or they "walk out" of their receptacles.

In testing electrical devices using such spring-loaded contact probes, it is desired that the probes each extend a uniform distance from the ends of their corresponding receptacles. This maintains a uniform pressure on the electrical device and ensures that each probe makes reliable electrical contact with the device under test. The plunger barrel assemblies that walk out of their receptacles impose a non-uniform pressure on the electrical device. Since they extend a greater distance from the plane of the test fixture, they can prevent other properly seated plungers from making an electrical contact with the device under test.

Approaches have been taken in the past to solve the problem of plunger barrel assembly walk out. It is desirable that the plunger barrel assembly be releasably fitted within its receptacle to accommodate various switching probe types depending upon the different types of electrical device to be tested. Accordingly, the approaches taken to solve this problem are also aimed at preserving the releasable engagement between the plunger barrel assemblies and their corresponding receptacles, i.e., the plunger barrel assemblies are not permanently affixed to their receptacles.

One approach to reducing plunger barrel assembly walk out has been to form the barrel with a slightly bowed shaped along its axis while the receptacle is unbowed. This produces a releasable friction interference fit which reduces walk-out. However, after repeated test cycling, the interference fit ultimately wears under repeated contact between the plunger and abutting crimped end portion, allowing the plunger barrel assemblies to walk out of their receptacles.

It is, therefore, an objective of this invention to construct a spring-loaded contact probe that eliminates plunger barrel assembly walk out from a receptacle. It is desirable that the spring-loaded contact probe be constructed in a manner that facilitates releasable engagement with the receptacle so as to accommodate use with a variety of different probe designs. The spring-loaded contact probe also should be capable of use with conventional crimp-type receptacles that may or may not already be installed in an electrical test fixture. The resulting contact probe also should accomplish these objectives at a reasonable cost.

SUMMARY OF THE INVENTION

Briefly, one embodiment of the invention comprises an anti-walk-out spring probe for placement within a probe receptacle for performing electrical tests on a unit under test. An anti-walk-out spring probe constructed according to principles of this invention includes a barrel, and a plunger disposed within the barrel for slidable axial displacement within the barrel. The plunger includes a tip at one end positioned outside the barrel for electrical contact with the device under test. A terminal member is rigidly secured within the barrel at an end opposite the plunger. The terminal member includes an end portion positioned outside of the barrel. At least one flanged locking end extends radially outward from the end portion of the terminal. The flanged locking end has a shoulder facing toward the barrel. A slot extends axially along the end portion of the terminal member to reduce the cross sectional size of the terminal so as to form a laterally flexible end section of the terminal that carries the flanged locking end of the terminal.

The probe is installed into a probe receptacle by inserting the end portion of the terminal member through a terminal portion of the receptacle, causing the locking flanges to deflect radially inward toward one another owing to the enhanced lateral flexibility of the slotted end section. This locking end section can travel through the terminal end portion of the receptacle, in its inwardly deflected position, until the flanged locking end bypasses the end of the receptacle, where the shoulder on the flanged locking end is snap locked into engagement with the end of the receptacle to prevent axial travel of the barrel in the receptacle.

BRIEF DESCRIPTION OF THE DRAWINGS

These and other features and advantages of the present invention will become appreciated as the same becomes better understood with reference to the specification, claims and drawings wherein:

DETAILED DESCRIPTION

Figure 1:
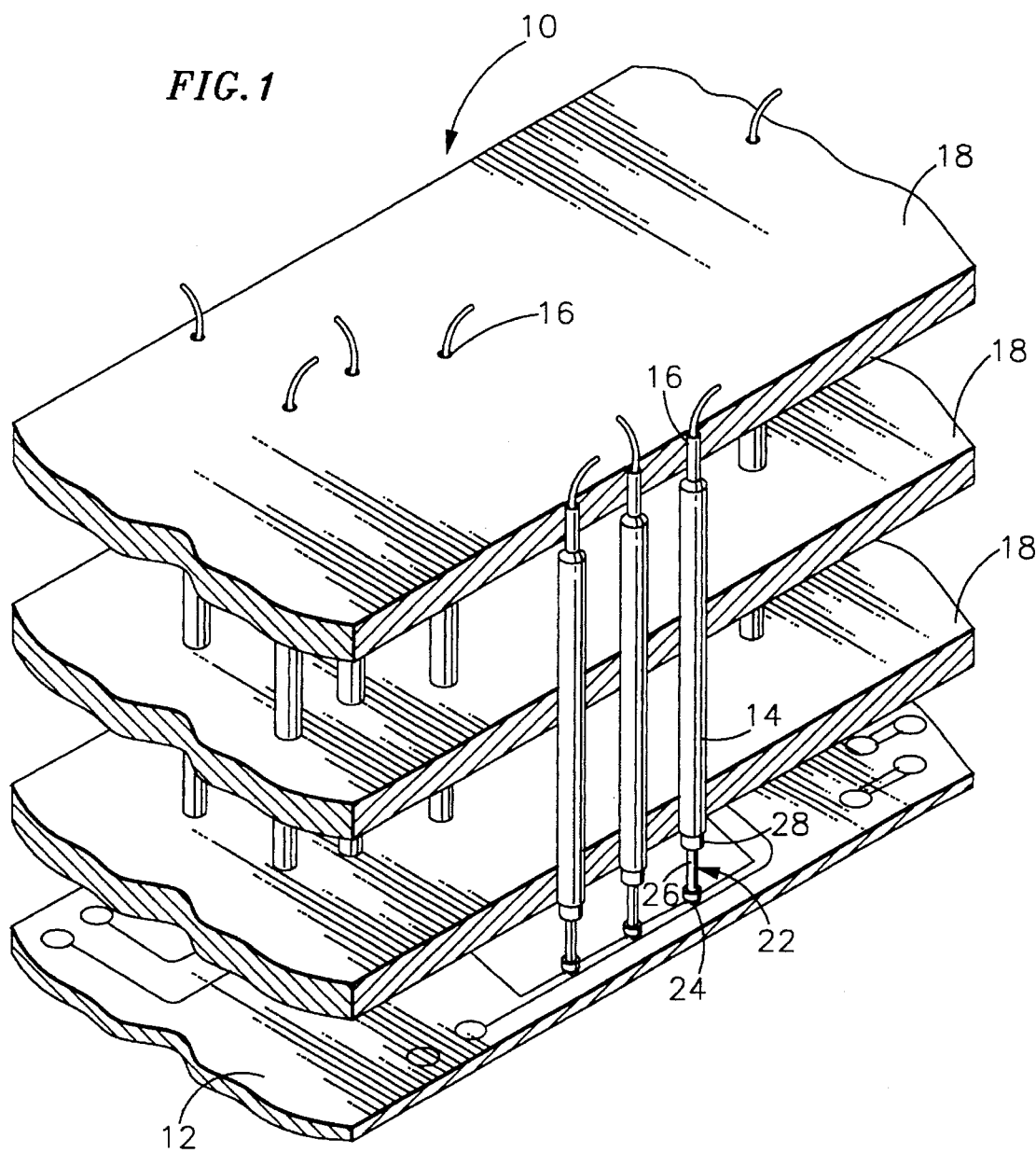
FIG. 1 is a semi-schematic perspective view of a test fixture comprising a plurality of probe receptacles containing anti-walk-out spring probes according to principles of this invention.

FIG. 1 illustrates a test fixture 10 that is used to perform continuity and diagnostic electrical tests on an electrical device 12 such as a printed circuit board or the like. The electrical device under test is commonly referred to as a unit under test, or a "UUT." The test fixture 10 comprises a plurality of tubular probe receptacles 14 each mounted within holes 16 drilled in probe plates 18 forming the test fixture. The holes 16 are arranged in a predetermined pattern corresponding to electrical contacts 20 on the electrical device 12 that is to be tested. It is to be understood that the test fixture illustrated in FIG. 1 is simplified for purposes of reference and clarity, and that anti-walk-out spring probes constructed according to principles of this invention are meant to be used with test fixtures configured other than that specifically described and illustrated.

An anti-walk-out spring probe 22 is disposed within each receptacle 14 and comprises a head portion or tip 24 at one end of a probe plunger 26. The plunger 26 is mounted within a barrel 28 so that the tip 24 of the plunger extends axially away from the barrel 28, the receptacle 14, and test fixture 10, toward the electrical device 12. The plunger tip 24 has an end portion configured to facilitate electrical contact with the electrical contacts 20 on the electrical device. The plunger tip may comprise a number of different geometric configurations such as single point, multiple point, concave point and the like, depending on the particular configuration of the electrical contacts on the electrical device under test.

Figure 2:
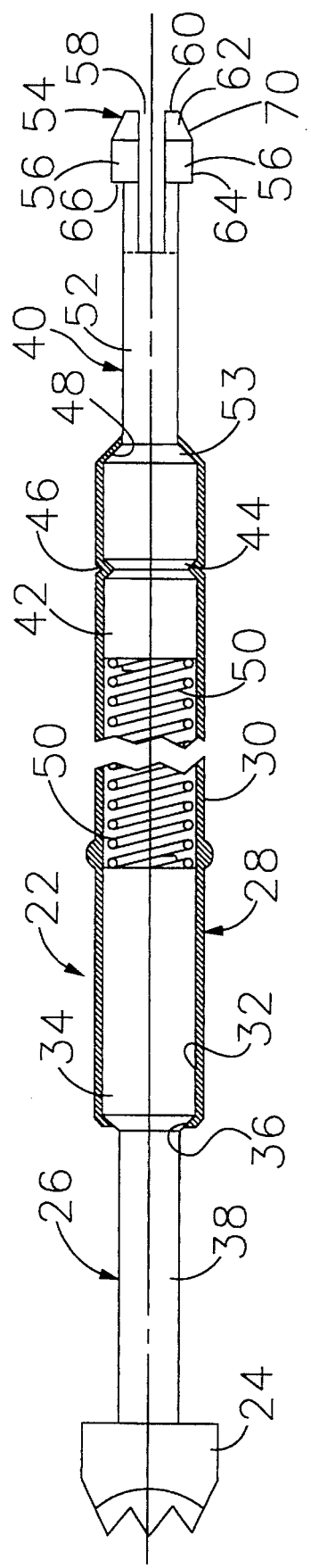
FIG. 2 is a cross-sectional side view of an anti-walk-out spring probe constructed according to principles of this invention.

Referring to FIG. 2, the barrel 28 comprises a tubular housing 30 of circular cross section and generally uniform diameter from end to end forming a long passage 32 therethrough. In a preferred embodiment, the barrel has a diameter of approximately 0.2 millimeters (0.08 inches) and has a length of approximately 24 millimeters (0.95 inches). The barrel is made from an electrically conductive material such as copper, a metal alloy such as beryllium-copper, or the like. Additionally, the metal selected to form the barrel may be plated with a material having properties of enhanced electrical conductivity such as gold and the like to improve the electrical conductivity of the barrel, and thus, electrical conductivity of the probe.

The plunger 26 includes an elongated, enlarged diameter internal section 34 having a cylindrical configuration disposed axially within the passage in the barrel 28 to permit slidable axial travel in the barrel. The internal section 34 has an outside diameter of approximately the same dimension as an inside diameter of the barrel 28 to maintain alignment of the plunger during sliding travel within the barrel. The barrel includes a crimped end portion 36 to retain the internal section 34 of the plunger within the barrel.

The plunger 26 also includes an elongated intermediate section 38 that extends between the enlarged diameter section 34 and the tip 24. The intermediate section 38 extends outside the barrel and is referred to as an external section of the plunger. This plunger section has a cylindrical cross sectional configuration with an outside diameter smaller than the diameter of either the enlarged diameter section 34 or the plunger tip 24. In a preferred embodiment, the intermediate section 38 has an outside diameter of approximately 1.3 millimeters (0.05 inches) and has a length of approximately 6 millimeters (0.25 inches). The tip 24, intermediate section 38, and enlarged diameter internal section 34 can be integral with one another or can be independent members attached together to form the probe plunger 26. They are formed from an electrically conductive material such as copper, a metal alloy, such as beryllium-copper, or the like. Each component may be made from a material different from or similar to the material of the other components. Additionally, the material selected to form each component may be plated with a highly conductive material such as gold and the like to enhance electrical conductivity.

A terminal member 40 is partially disposed axially within the barrel at an end opposite to the plunger 26. The terminal member 40 is formed from the same materials previously described for forming barrel and the components making up the probe plunger 26. The terminal member includes a head portion 42 that is completely disposed within the barrel and has an outside diameter of approximately the same dimension as the diameter of the barrel. The head portion 42 includes a groove 44 that extends circumferentially around the head portion at a location near the midpoint of the length of the head portion. In a preferred embodiment, the groove 44 is configured having V-shaped walls perpendicular to one another and at 45 degree angles to the surface of the head portion. The head portion 42 is fixedly retained within the barrel by an inwardly directed crimp 46 that extends circumferentially around the outside diameter of the barrel housing 30 and extends into the groove 44, thereby forming a locked interference fit therebetween. The barrel has a crimped end portion 48 adjacent the head portion 42 that also serves to prevent outward travel of the head portion and, thereby retains the head portion within the barrel. In a preferred embodiment, the head portion 42 has a length of approximately 5 millimeters (0.18 inches) and the terminal member 40 has a total length of approximately 12.7 millimeters (0.5 inches).

A spring 50 is disposed within the barrel between the internal section 34 of the plunger 26 and the head portion 42 of the terminal member 40. The spring is of the type used with conventional spring probes and is made from an electrically conductive material such as metal, metal alloy and the like. It is desired that the spring provide a predetermined degree of compression force to the plunger to both facilitate slidable axial displacement of the internal section within the barrel and impose a sufficient compression force between the tip 24 and the electrical device 12 to ensure good electrical contact therebetween.

The terminal member 40 includes a tail portion 52 that extends outwardly away from the barrel. A transition portion 53 extends between the head and tail portions 42 and 52, respectively, and is configured having an angled surface to accommodate abutment against the complementary sloped surface of the crimped end 48 of the barrel housing 30.

The tail portion 52 can either be integral with the head portion or attached by welding and the like to provide a good mechanical and electrical connection with the head portion. The tail portion 52 includes an flanged locking end 54 located at the end of the tail portion opposite to the head portion. The tail portion 52 has a diameter that is both smaller than the diameter of the head portion 42 and longer in length than the head portion. In a preferred embodiment, the tail portion has a diameter of approximately 1 millimeter (0.042 inches) and has a length of approximately 6 millimeters (0.25 inches), not including the length of the flanged locking end 54.

Figure 3:
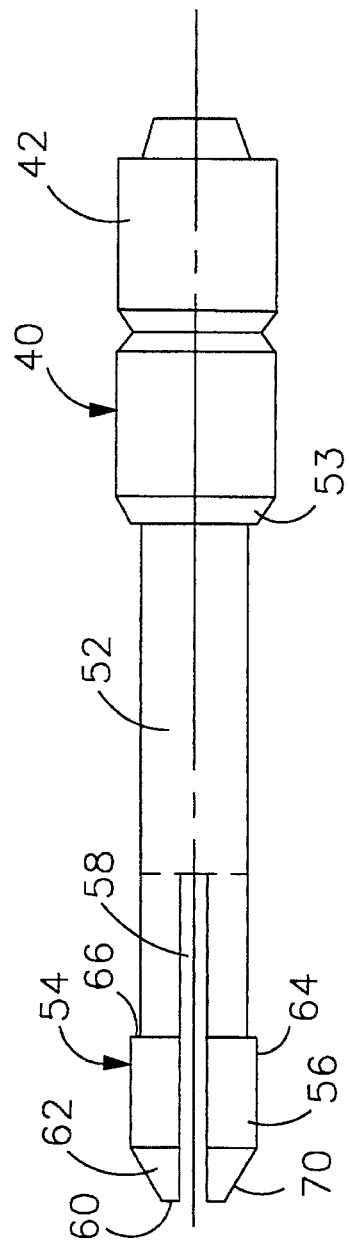
FIG. 3 is an enlarged side elevational view showing a terminal member of the anti-walk-out spring probe of FIG. 2.
Figure 4:
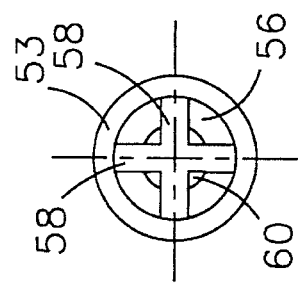
FIG. 4 is an end elevational taken on line 4—4 of FIG. 3.

As best shown in FIG. 3, the flanged locking end 54 includes a number of flanges 56 that each extend radially outward away from the surface of the flanged end. The flanged end 54 also comprises a number of axial slots 58 that extend from a peripheral edge or tip 60 of the flanged end 54 a predetermined distance toward the head portion of the terminal member. In a preferred embodiment, the flanged locking end 54 comprises four flanges 56 that are each positioned at 90 degree intervals around the circumference of the flanged end. Each horizontally opposed flange pair is separated by an axial slot 58. Accordingly, in a preferred embodiment, the flanged end portion comprises two axial slots 58 that are positioned perpendicular to one another, as best shown in FIG. 4. As will be discussed in greater detail below, the flanged locking end 54 configured in the flange and slots arrangement provides locking engagement with a receptacle that eliminates spring probe walk out from the receptacle after repeated test cycling.

Figure 5:
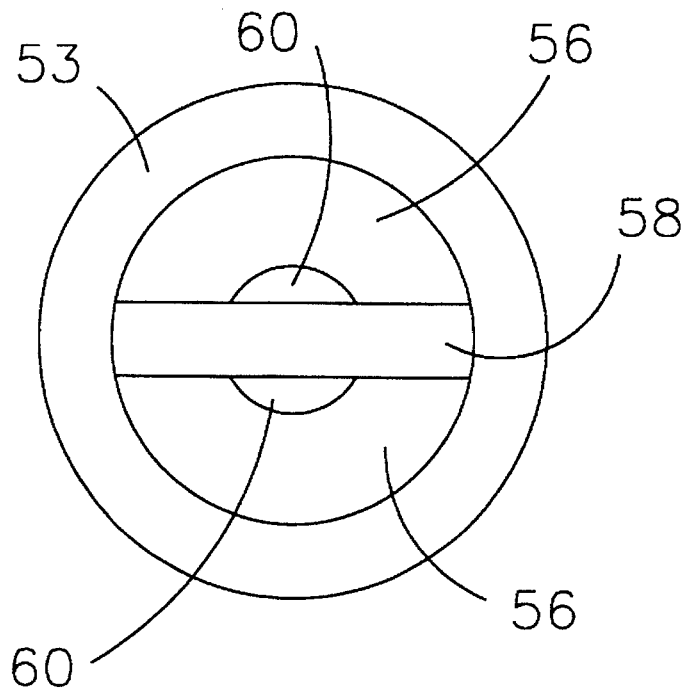
FIG. 5 is an enlarged end elevational view of a flanged locking end an alternative embodiment of the anti-walk-out spring probe comprising two diametrically opposed locking flanges.
Figure 6:
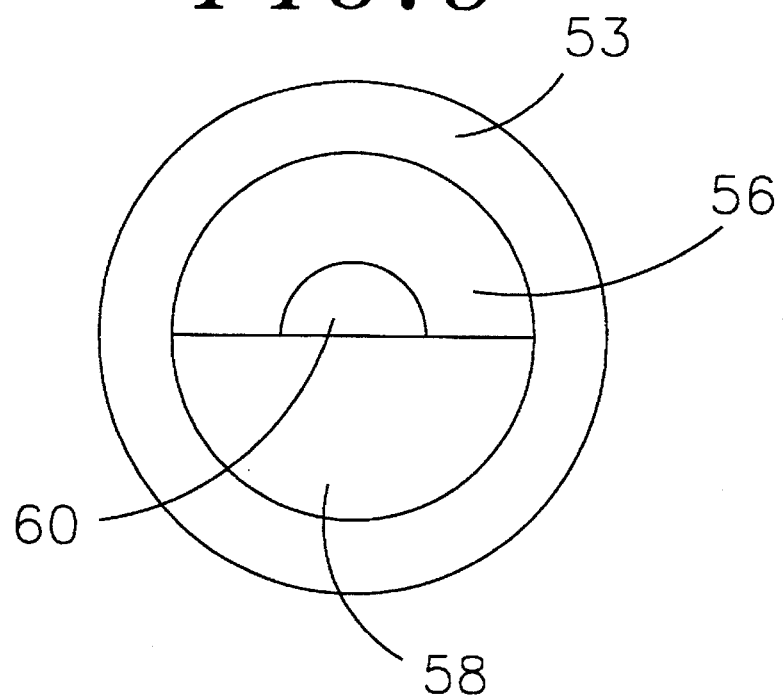
FIG. 6 is an enlarged end elevational view of a flanged locking end of another alternative embodiment of the anti-walk-out spring probe comprising one locking flange.

Alternatively, the spring probe 22 can be configured having only two flanges 56 that extend radially outward from the flanged locking end 54, as shown in FIG. 5. In this embodiment, the flanges are positioned so that they are diametrically opposed to one another and are separated by a single axial slot 58. A still different embodiment of the spring probe may be one having only one flange 56 that extends radially outward from the flanged locking end 54, as shown in FIG. 6. In this still different embodiment, the axial slot 58 is formed adjacent the flange and includes the remaining portion of the flanged locking end 54.

Each flange includes a leading edge 62 located at the front or leading portion of the flanged end, opposite to the head portion, a side portion 64 adjacent the leading edge, and a shoulder 66 adjacent the side portion and directed toward the head portion. The leading edge 62 is configured having an flat end surface forming the tip 60 and a tapered surface 70 to accommodate insertion of the flanged locking end 54 into a terminal portion of the receptacle that will be explained in greater detail below. In a preferred embodiment the leading edge 62 comprises a flat end surface having a diameter of approximately 0.8 millimeters (0.03 inches), and a angled tapered 70 that has an angle of departure of approximately 30 degrees as measured from an axis running along the terminal member 40. The flanged locking end 54 has an outside diameter of approximately 1.4 millimeters (0.055 inches) as measured across side portions 64 of diametrically opposed flanges 56. Accordingly, each side portion 64 extends approximately 0.2 millimeters (0.008 inches) from the surface of the tail portion 52. As will be discussed below, the outside diameter of the flanged locking end 54 is larger than an inside diameter of a terminal portion of the receptacle. The slots 58 permit radially directed inward movement of the flanges 56 during placement of the flanged locking end into the terminal portion of the receptacle to facilitate installation of the anti-walk-out spring probe into the receptacle. In a preferred embodiment, each slot 58 extends axially along the flanged end 54 a length of approximately 4 millimeters (0.15 inches) and has a slot opening of approximately 0.3 millimeters (0.012 inches). It has been discovered that this combination of slot length and slot opening using two perpendicular slots, i.e., forming four flanges 56, provides a sufficient amount of inwardly directed radial flange movement to facilitate installation of the flanged end portion 54 through the terminal portion of the receptacle.

The shoulder 66 of each flange 56 is configured to provide a releasible snap lock attachment with an abutting portion of the receptacle. In a preferred embodiment, each shoulder 66 has a length equal to the distance that the side portions 64 extend from the surface of the tail portion 52, i.e., approximately 0.2 millimeters (0.008 inches). It has been discovered that a shoulder having a surface configured with a backwardly directed rake angle, i.e., not perpendicular to the side portion 64, provides a releasible snap lock attachment with a receptacle that will not accidentally release upon axial displacement of the plunger 26 within the barrel 28, thereby eliminating walk out of the barrel from the receptacle during testing. In a preferred embodiment, the shoulder 66 of each flange is configured having a backwardly directed rake angle of at least five degrees with respect to a plane perpendicular to an axis running along the terminal member 40.

Figure 7:
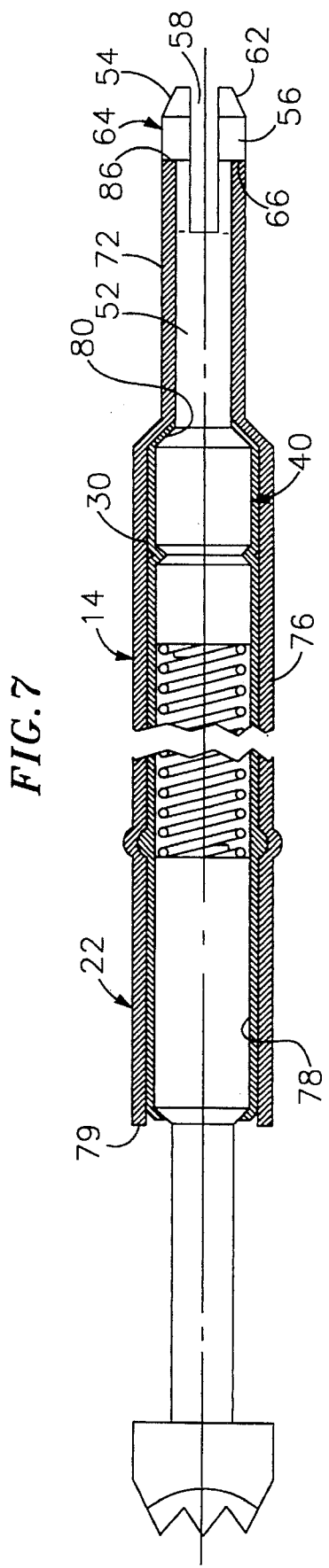
FIG. 7 is a fragmentary cross-sectional view of the anti-walk-out spring probe of FIG. 2 assembled within a probe receptacle.

FIG. 7 illustrates the anti-walk-out spring probe 22 constructed in accordance with principles of this invention after it has been installed within a receptacle 14. The receptacle 14 comprises a housing 76 having a cylindrical configuration and an annular opening 78 that extends therethrough. The receptacle has an open end 79 at one end of the housing and a partially closed end 80 at an opposite end that defines a terminal portion 72 of the housing 76. The terminal portion 72 is formed from a reduced diameter portion of the receptacle 14 configured to accommodate placement of the tail portion 52 and flanged end 54 of the terminal member 40 therein. Accordingly, the receptacle is constructed having an inside diameter at a non-reduced diameter portion similar to the outside diameter of the barrel housing 30 to facilitate slidable axial movement therebetween, and an inside diameter at the terminal portion 72 similar to the outside diameter of the tail portion 52 to facilitate slidable axial movement therebetween. The terminal portion 72 is configured having a length equal to the length of the tail portion, i.e., approximately 0.6 millimeters (0.025 inches) in a preferred embodiment.

The anti-walk-out spring probe is installed within the receptacle 14 by aligning the flanged locking end 54 of the terminal member 40 with the open end 79 of the receptacle and inserting the terminal member 40 and barrel 28 into the annular opening 78 of the receptacle 14. As the anti-walk-out spring probe 22 is axially displaced within the annular opening 78, the leading edges 62 of each flange 56 extending from the flanged locking end 54 contacts a tapered partially closed end 80 of the terminal portion 72 of the receptacle, causing the flanges to be displaced radially inward by operation of the slots 58. The action of the side portions 64 of the fins against the inside surface of the terminal portion 72 of the receptacle keeps the flanges 56 in a radially inwardly displaced position as the flanged locking end is passed through the terminal portion.

As the anti-walk-out probe 22 is displaced further into the receptacle 14, the flanged end 54 of the terminal member 40 exits a terminal opening 86 of the receptacle. While still in the radially displaced positioned, continued axial displacement of the anti-walk-out probe vis-a-vis the receptacle causes the side portions 64 to pass through the terminal opening 86. Finally, with continued axial displacement, the shoulder 66 of each flange 56 passes through the terminal opening 86, causing the flanges to be radially displaced outwardly, i.e., snap outwardly, to their relaxed position and the shoulder 66 of each flange to form a locking abutment against an outside edge of the terminal opening 86. The snap lock fit of the shoulder 66 against the outside edge forms a releasable locking attachment between the anti-walk-out probe and the receptacle, thereby preventing outwardly directed axial displacement, i.e., walk out, of the probe from the receptacle.

The backwardly directed rake angle of each shoulder 66 ensures that repeated test cycling of the probe, i.e., inwardly and outwardly directed axial displacement of the plunger 26 within the barrel 28, will not cause the locking attachment of the probe and receptacle it to be accidentally released. To remove the anti-walk-out probe from the receptacle it is necessary to impose an inwardly directed radial force on each of the flanges 56, to retract them into respective slots 58, and simultaneously impose an axially directed inward force on the flanged end 54, to cause the tail portion 52 to be retracted into the terminal portion 72 of the receptacle.

If desired, detents between the inside surface of the receptacle and the outside surface of the barrel can also be used in addition to the locking engagement of the shoulder of each flange and outside edge of the terminal opening, to enhance the locking attachment of the probe with the receptacle. Accordingly, it is to be understood that the principles of this invention may be used to supplement existing methods of locking attachment between probe and receptacle members as well as supplant them.

Although a particular embodiment of the anti-walk-out spring probe 22 has been specifically desired and illustrated, it is to be understood that other embodiments of the anti-walk-out spring probe are meant to be within the scope of this invention. For example, a preferred embodiment of the probe has been described having particular dimensions. It is to be understood that the dimensions provided are only illustrative of one size of the probe for a particular application, i.e., a particular electrical device. The anti-walk-out probe may be constructed according to principles of this invention having different dimensions to accommodate use in testing a variety of different electrical devices.

Although a preferred embodiment of an anti-walk-out spring probe has been specifically described and illustrated, it is to be understood that variations or alternative embodiments apparent to those skilled in the art are within the scope of this invention. Since many such variations may be made, it is to be understood that within the scope of the following claims, this invention may be practiced otherwise than specifically described.

What is claimed is:

1. A spring probe assembly for placement within a probe receptacle for performing tests on an electrical device, the spring probe assembly comprising:
   an elongated barrel having an opening extending axially through the barrel wherein the barrel is adapted to be axially disposed within the probe receptacle;
   a plunger slidably disposed within the opening at a first end of the barrel;
   a terminal member fixedly disposed within the opening at an opposite second end of the barrel, the terminal member having a terminal portion extending beyond the second end of the barrel;
   a spring disposed within the opening of the barrel between the plunger and the terminal member; and
   means for providing releasable locking attachment of the terminal portion of the terminal member with an opening in a terminal end of the receptacle, said means being integral with an end of the terminal portion and being adapted to accommodate placement within the receptacle when released from a locked position, wherein the locking attachment prevents relative travel between the receptacle and barrel during spring-biased reciprocating travel of the plunger in the barrel when placed in a locked position.

2. The spring probe as recited in claim 1 wherein the plunger comprises a tip at one end for accommodating contact with an electrical contact of an electrical device.

3. The spring probe as recited in claim 1 wherein the end of the barrel adjacent the plunger is crimped to limit outwardly directed axial displacement of the plunger from the barrel.

4. The spring probe as recited in claim 1 wherein the terminal member comprises a groove extending circumferentially around an outside surface disposed within the barrel.

5. The spring probe as recited in claim 4 wherein the barrel comprises a crimped portion around an outside surface that corresponds with the location of the groove for prohibiting axial movement of the terminal member within the barrel.

6. The spring probe as recited in claim 4 wherein the end of the barrel adjacent the terminal member is crimped to limit outwardly directed axial displacement of the terminal member from the barrel.

7. The spring probe as recited in claim 5 wherein the means for providing locking attachment of the probe with a probe receptacle comprises:
   at least one flange extending radially outward from a flanged end of the terminal member positioned outside of the barrel, wherein the flange includes a shoulder directed toward the barrel and substantially perpendicular to an axis along the terminal member;
   at least one slot extending axialiy along a length of the flanged end adjacent the flange, wherein the flanged end extends through an opening in a terminal portion of the receptacle and the shoulder is in locking abutment against an outside edge of the opening.

8. The spring probe as recited in claim 7 wherein said means for providing locking attachment comprises four diametrically opposed flanges and two slots, wherein the slots are perpendicular to one another and each slot separates diametrically opposed flanges.

9. The spring probe as recited in claim 7 wherein the shoulder has a backwardly directed rake angle of at least five degrees.

10. The spring probe as recited in claim 7 wherein the flanges have an outside diameter greater than an inside diameter of the terminal portion of the receptacle.

11. A spring probe and probe receptacle assembly for performing tests on an electrical device, the assembly comprising:
   a plunger having a tip at one end for contacting an electrical contact of an electrical device;
   a barrel having an axial opening therethrough, wherein a portion of the plunger is slidably displaced within a first end of the barrel;
   a terminal member partially disposed within the opening at a second end of the barrel opposite from the plunger, wherein the terminal member is fixedly attached to the barrel and includes a terminal end portion that extends outwardly away from the second end of the barrel;

a spring within the opening and interposed between the plunger and the terminal member; and a probe receptacle having an axial opening therethrough accommodating the barrel therein, wherein the terminal end portion of the terminal member extends through a terminal portion of the receptacle and outwardly from an opening through an end of the terminal portion of the receptacle, wherein the terminal end portion is adapted to accommodate placement within the terminal portion of the receptacle when released from a locked position, and accommodate releasably locking attachment against the opening through the end of the terminal portion of the receptacle when placed outside of the receptacle in a locked position.

12. The assembly as recited in claim 11 wherein the locking attachment includes:

at least one flange extending radially outwardly from the end portion of the terminal member, wherein the flange has a shoulder portion in locking abutment with an outside edge of the opening through the terminal portion of the receptacle; and at least one slot extending axially a distance from a tip of the terminal end portion, wherein the slot is adjacent the flange, and wherein the slot accommodates inward radial movement of the flange during installation of the end portion through the terminal portion of the receptacle.

13. The assembly as recited in claim 12 wherein said locking attachment comprises:

four flanges each positioned at 90 degree intervals around the end portion of the terminal member; and two perpendicular slots, wherein each slot separates two diametrically opposed flanges.

14. The assembly as recited in claim 13 wherein the shoulder portion has a backwardly directed rake angle of at least five degrees.

15. The assembly as recited in claim 13 wherein diametrically opposed flanges have a diameter greater than an inside diameter of the terminal portion of the receptacle.

16. A spring probe assembly for placement within a probe receptacle for performing electrical tests on an electrical device, the spring probe assembly comprising;

a barrel having an axial opening therethrough, wherein the barrel is adapted to fit axially within the probe receptacle;

a plunger partially disposed within a first end of the opening, wherein a partially disposed plunger portion is capable of slidable axial displacement within the opening in the barrel, and wherein the plunger includes a tip at an end extending from the barrel for providing electrical contact with an electrical device;

a terminal member mounted within the opening at a second end of the barrel opposite from the plunger, wherein the terminal member includes a flanged terminal end extending away from the second end of the barrel and comprising;

at least one flange extending radially outward from the flanged terminal end, wherein the flange has a portion thereof directed toward the barrel and extending substantially perpendicular to an axis running along the terminal member; and at least one slot through the flanged end extending axially from a tip portion of the flanged end toward the barrel; and a spring disposed within the barrel in contact with an end of the plunger opposite from the plunger tip.

17. The spring probe as recited in claim 16 wherein each end of the barrel is crimped inwardly to limit outwardly directed axial displacement of the plunger and the terminal member.

18. The spring probe as recited in claim 16 wherein the terminal member comprises a groove extending circumferentially around an outside surface.

19. The spring probe as recited in claim 18 wherein the barrel comprises a crimped portion around an outside surface at a position corresponding to the groove so that the crimped portion substantially fills the groove, thereby fixing the terminal member within the annular opening of the barrel.

20. The spring probe as recited in claim 16 wherein said flanged terminal end comprises four flanges each positioned at 90 degree intervals around the flanged end of the terminal member, and comprising two perpendicular slots, wherein each slot separates two diametrically opposed flanges.

21. The spring probe as recited in claim 20 wherein radially opposed flanges have an outside diameter greater than an inside diameter of a terminal portion of a probe receptacle.

22. The spring probe as recited in claim 20 wherein the said flanged terminal end has a shoulder portion with a backwardly directed rake angle of at least five degrees.

23. A spring probe assembly for placement within a probe receptacle for performing electrical tests on an electrical device, the spring probe assembly comprising:

a barrel having an axial opening therethrough, wherein the barrel is adapted to fit axially within the probe receptacle;

a plunger partially disposed within the opening at a first end of the barrel and capable of slidable axial movement therein, wherein the plunger includes a tip at an end outside of the barrel for making contact with an electrical device, and wherein the end of the barrel adjacent the plunger is crimped to limit outward axial movement of the plunger;

a terminal member disposed within the opening at a second end of the barrel opposite from the plunger and fixedly attached therein, and wherein the terminal member comprises:

a head portion disposed within the opening in the barrel, wherein the head portion includes a groove extending circumferentially around an outside surface of the head portion, and wherein the barrel includes a crimped portion engaged with the groove and forming a fixed attachment to inhibit outward axial-movement of the terminal member from the barrel;

a flanged end extending from the head portion to a position outside of the barrel;

four flanges located at equidistant positions around a circumference of the flanged end and each extending radially outward from the flanged end, wherein diametrically opposed flanges have an outside diameter greater than an inside diameter of a terminal portion of a probe receptacle, and wherein each flange includes a shoulder portion that forms a locking abutment against an opening in the terminal portion of the receptacle, thereby locking the probe and receptacle together; and two axial slots in the flanged end and each extending along an axis of the terminal member and positioned perpendicular to one another, wherein the slots are each positioned between diametrically opposed flange pairs.

24. A spring probe assembly for placement within a probe receptacle for performing tests on an electrical device, the spring probe assembly comprising:

an elongated barrel having an opening extending axially through the barrel wherein the barrel is adapted to be axially disposed within the probe receptacle;

a plunger slidably disposed within the opening at a first end of the barrel;

a terminal member fixedly disposed within the opening at an opposite second end of the barrel, the terminal member having a terminal portion extending beyond the second end of the barrel and having a groove extending circumferentially around an outside surface that is disposed within the barrel, the barrel having a portion of the opening crimped inwardly against the groove for prohibiting axial movement of the terminal member within the barrel; and a spring disposed within the opening of the barrel between the plunger and the terminal member;

the terminal member including:

at least one flange extending radially outward from a flanged end of the terminal member positioned outside of the barrel, wherein the flange includes a shoulder directed toward the barrel and substantially perpendicular to an axis along the terminal member; and at least one slot extending axially along a length of the flanged end adjacent the flange, wherein the flanged end extends through an opening in a terminal portion of the receptacle and the shoulder is in locking abutment against an outside edge of the opening to releasably lock the barrel and receptacle together.

25. The spring probe as recited in claim 24 wherein the spring probe comprises four diametrically opposed flanges and two slots, wherein the slots are perpendicular to one another and each slot separates diametrically opposed flanges.

26. The spring probe as recited in claim 24 wherein the shoulder has a backwardly directed rake angle of at least five degrees.

27. The spring probe as recited in claim 25 wherein the flanges have an outside diameter greater than an inside diameter of the terminal portion of the receptacle.

28. A spring probe and probe receptacle assembly for performing tests on an electrical device, the spring probe assembly comprising:

a plunger having a tip at one end for contacting an electrical contact of an electrical device;

a barrel having an axial opening therethrough, wherein a portion of the plunger is slidably displaced within a first end of the barrel;

a terminal member partially disposed within the opening at a second end of the barrel opposite from the plunger, wherein the terminal member is fixedly attached to the barrel and includes a terminal end portion that extends outwardly away from the second end of the barrel;

a spring within the opening and interposed between the plunger and the terminal member; and a probe receptacle having an axial opening therethrough accommodating the barrel therein, wherein the terminal end portion of the terminal members extends through a terminal portion of the receptacle and outwardly from an opening through an end of the terminal portion of the receptacle;

the terminal member including:

at least one flange extending radially outward from the terminal end portion, wherein the flange has a shoulder portion in locking abutment with an outside edge of the opening through the end in the terminal portion of the receptacle; and at least one slot in the end portion extending axially a distance from a tip of the end portion, wherein the slot is adjacent the flange, and wherein the slot accommodates inward radial movement of the flange during installation of the end portion through the terminal portion of the receptacle.

29. The assembly as recited in claim 28 wherein the terminal member comprises:

four flanges each positioned at equidistantly intervals around the end portion of the terminal member; and two perpendicular slots, wherein each slot separates two diametrically opposed flanges.

30. The assembly as recited in claim 28 wherein terminal member includes a shoulder portion having a backwardly directed rake angle of at least five degrees.

31. The assembly as recited in claim 28 wherein the terminal member includes diametrically opposed flanges that have a diameter greater than an inside diameter of the terminal portion of the receptacle.

\* \* \* \* \*

UNITED STATES PATENT AND TRADEMARK OFFICE
CERTIFICATE OF CORRECTION

PATENT NO. : 5,557,213
DATED : September 17, 1996
INVENTOR(S) : Mark S. Reuter; John A. Geranis It is certified that error appears in the above-indentified patent and that said Letters Patent is hereby corrected as shown below:

Title page

Item 56, References Cited, U.S. Patent Documents,
  change "3,761,871  9/1973  Tawlings . . . 439/751"
  to -- 3,761,871  9/1973  Teurlings . . . 439/751 --.
Column 2, line 12, change "bowed shaped" to -- bowed shape --.
Column 3, line 12, after "elevational" insert -- view --.
Column 3, line 15, after "end" insert -- of --.
Column 3, lines 59, 60, change "inches" to -- inch -- (both occurrences).
Column 4, lines 18,19, change "inches" to -- inch -- (both occurrences).
Column 4, line 33, after "forming" insert -- the --.
Column 4, lines 51,53, change "inches" to -- inch -- (both occurrences).
Column 5, line 8, replace "an flanged" with -- a flanged --.
Column 5, lines 13,14, change "inches" to -- inch -- (both occurrences).
Column 5, line 50, after "having" change "an" to -- a --.
Column 5, lines 56, 57, replace "(0.03 inches), and a angled tapered 70"
  with -- (0.03 inch), and an angled tapered surface 70 --.
Column 5, lines 61, 63, change "inches" to -- inch -- (both occurrences).
Column 6, lines 6, 7, 18, 48, change "inches" to -- inch -- (all occurrences).
Column 7, line 20, after "receptacle" delete "it".
Column 7, line 37, replace "desired" with --described--.

UNITED STATES PATENT AND TRADEMARK OFFICE
CERTIFICATE OF CORRECTION

PATENT NO. : 5,557,213
DATED : September 17, 1996
INVENTOR(S) : Mark S. Reuter; John A. Geranis It is certified that error appears in the above-indentified patent and that said Letters Patent is hereby corrected as shown below:

Column 8, line 40, change "axialiy" to -- axially --.
Column 12, line 17, change "members" to -- member --.

Signed and Sealed this

Twenty-sixth Day of August, 1997

Attest:

BRUCE LEHMAN

Attesting Officer

Commissioner of Patents and Trademarks